(12) United States Patent
Tu et al.

(10) Patent No.: US 8,053,856 B1
(45) Date of Patent: Nov. 8, 2011

(54) BACKSIDE ILLUMINATED SENSOR PROCESSING

(75) Inventors: Yeur-Luen Tu, Taichung (TW);
Chia-Shiung Tsai, Hsin-Chu (TW);
Ching-Chun Wang, Tainan (TW);
Ren-Jie Lin, Tainan (TW); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/830,719

(22) Filed: Jul. 6, 2010

Related U.S. Application Data (60) Provisional application No. 61/353,951, filed on Jun. 11, 2010.

(51) Int. Cl.
*H01L 31/0232* (2006.01)

(52) U.S. Cl. ........ 257/432; 257/414; 257/431; 257/440; 257/447; 257/448

(58) Field of Classification Search .................. None
See application file for complete search history.

(56) References Cited

U.S. PATENT DOCUMENTS 6,169,319 B1 * 1/2001 Malinovich et al. .......... 257/447

OTHER PUBLICATIONS

Hernan A. Rueda, "Modeling of Mechanical Stress in Silicon Isolation Technology and Its Influence on Device Characteristics", A Dissertation Presented to the Graduate School of the University of Florida in Partial Fulfillment of the Requirements for the Degree of Doctor of Philosophy, University of Florida, 1999, 150 pages.

* cited by examiner

*Primary Examiner* — N Drew Richards
*Assistant Examiner* — Kyoung Lee
(74) *Attorney, Agent, or Firm* — Haynes and Boone, LLP (57) ABSTRACT

The present disclosure provides methods and apparatus for reducing dark current in a backside illuminated semiconductor device. In one embodiment, a method of fabricating a semiconductor device includes providing a substrate having a frontside surface and a backside surface, and forming a plurality of sensor elements in the substrate, each of the plurality of sensor elements configured to receive light directed towards the backside surface. The method further includes forming a dielectric layer on the backside surface of the substrate, wherein the dielectric layer has a compressive stress to induce a tensile stress in the substrate. A backside illuminated semiconductor device fabricated by such a method is also disclosed.

19 Claims, 5 Drawing Sheets

BACKSIDE ILLUMINATED SENSOR PROCESSING

PRIORITY DATA

The present application claims priority to U.S. Provisional Application Ser. No. 61/353,951, filed Jun. 11, 2010, the entire disclosure of which is incorporated herein by reference in its entirety.

BACKGROUND

In semiconductor technologies, backside illuminated (BSI) sensors are used for sensing a volume of exposed light projected towards the backside surface of a substrate or sensor layer. The backside illuminated sensors can be formed in the substrate and light projected towards the backside of the substrate can reach the sensors. However, during BSI sensor processing, stress on the substrate or sensor layer is known to impact leakage current or dark current. In particular, stress on the device substrate or sensor layer may be caused by subsequent color filter processing and/or device packaging after leaving a fabrication facility, which can cause variations in dark current and thus negatively impact device performance or even possibly cause device degradation.

Therefore, while existing methods of fabricating semiconductor devices have been generally adequate for their intended purposes, they have not been entirely satisfactory in every aspect. In particular, improvements in backside illuminated sensor processing and/or the corresponding sensor substrate are desired.

BRIEF DESCRIPTION OF THE DRAWINGS

Aspects of the present disclosure are best understood from the following detailed description when read with the accompanying figures. It is emphasized that various features may not be drawn to scale. In fact, the dimensions of the various features may be arbitrarily increased or reduced for clarity of discussion.

DETAILED DESCRIPTION

The present disclosure relates generally to the fabrication of a semiconductor device, and more particularly, to methods for providing sensor isolation features in a semiconductor substrate and devices fabricated by such methods.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat or use similar reference numerals and/or letters in the various examples. This repetition is for the purpose of simplicity and clarity and does not in itself dictate a relationship between the various embodiments and/or configurations discussed.

Figure 1:
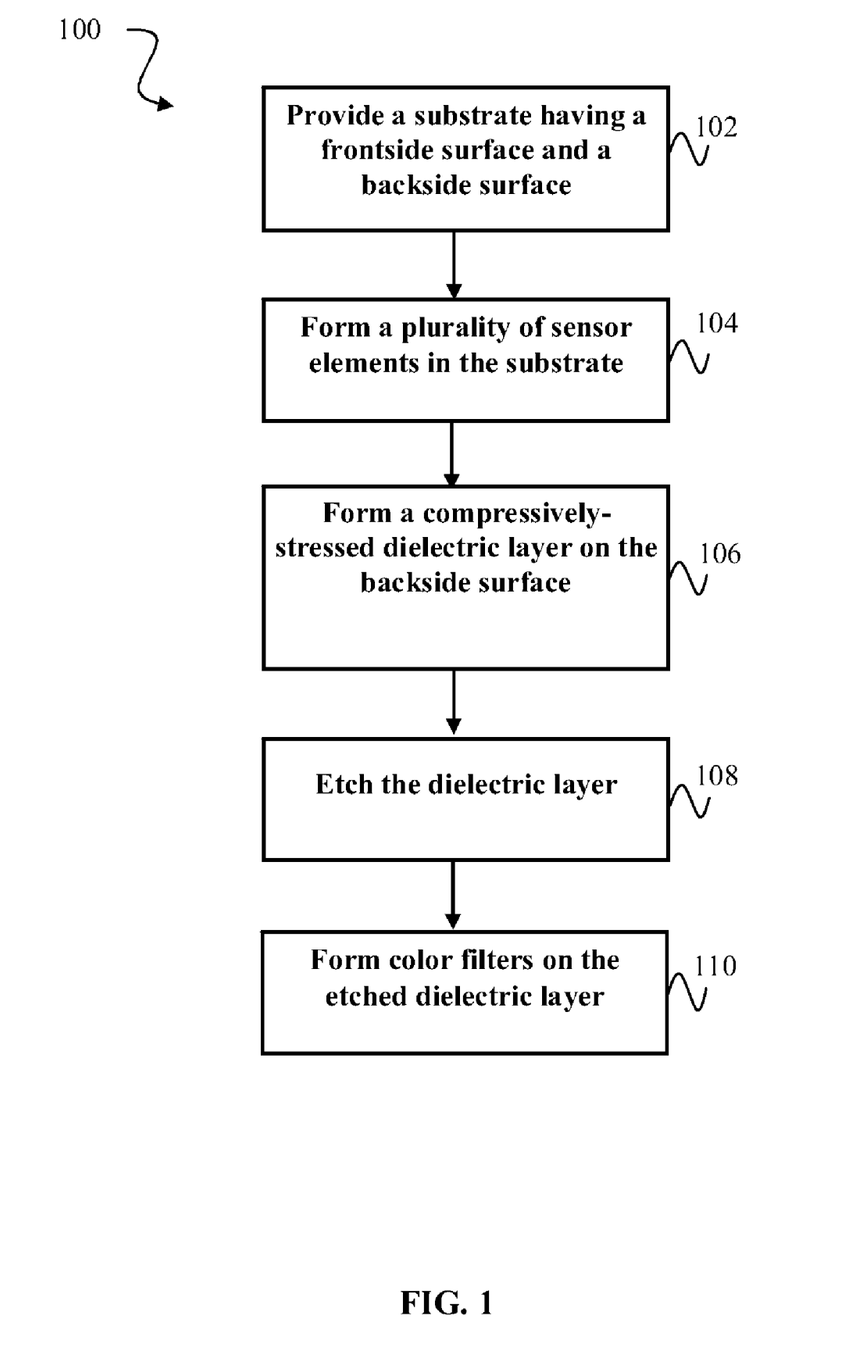
FIG. 1 is a flowchart illustrating a method of fabricating a semiconductor device according to various aspects of the present disclosure.

Referring now to the figures, FIG. 1 illustrates a flowchart of an example method for fabricating a semiconductor device including a compressively-stressed dielectric layer that induces a tensile stress in a sensor layer substrate. FIGS. 2A-2F illustrate cross-sectional views of intermediate stages in the manufacture of a backside illuminated sensor device in accordance with the method of FIG. 1. FIGS. 3A-3B illustrate a sectional view and a top view, respectively, of one embodiment of a semiconductor device having a plurality of backside illuminated sensors and a compressively-stressed dielectric layer constructed according to aspects of the present disclosure.

The semiconductor device may include an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors. It is understood that the figures may have been simplified for a better understanding of the inventive concepts of the present disclosure. Accordingly, it should be noted that additional processes may be provided before, during, and/or after the method of FIG. 1, and that some other processes may only be briefly described herein.

Referring now to FIG. 1, a method 100 begins with block 102 in which a substrate having a frontside surface and a backside surface is provided, for example a sensor layer in which is formed sensor elements, such as photodetectors. The method 100 continues with block 104, in which a plurality of sensor elements are formed in the substrate. Then, a dielectric layer is formed on the backside surface of the substrate, as shown in block 106. The dielectric layer has a compressive stress to induce a tensile stress in the substrate, which advantageously reduces dark current in the device which may be caused by subsequent processing on the device after the dielectric layer is formed. At block 108, the dielectric layer is etched or thinned, and then color filters, lenses, and/or other chip packaging is formed on the etched dielectric layer, as shown in block 110.

Figure 2A:
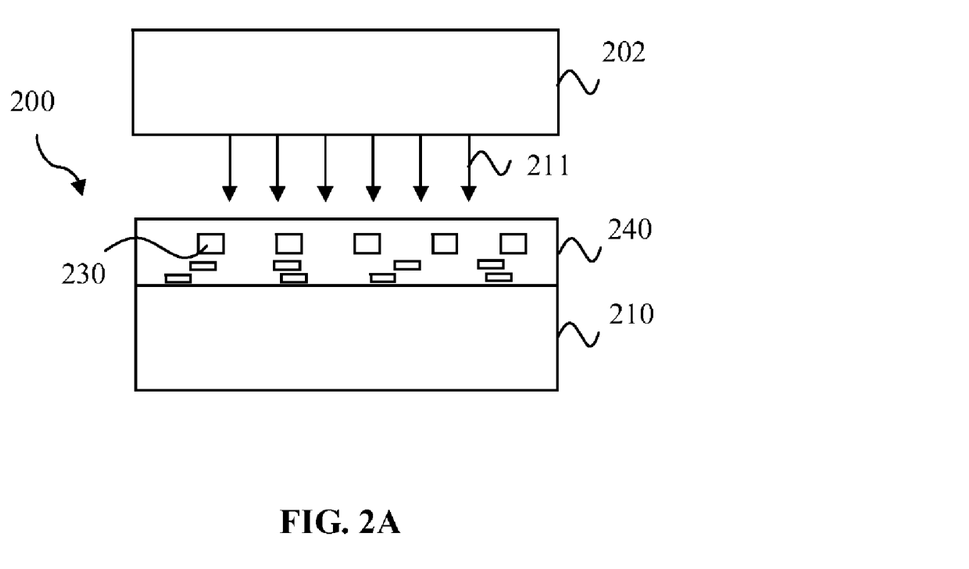
FIGS. 2A-2F illustrate cross-sectional views of intermediate stages in the manufacture of a backside illuminated sensor device in accordance with the method of FIG. 1.

Referring now to FIGS. 2A-2F, cross-sectional views of intermediate stages in the manufacture of a backside illuminated (BSI) sensor device 200 is illustrated in accordance with the method of FIG. 1. FIG. 2A illustrates a sectional view of a carrier wafer 202 being bonded by a bonding process 211 to BSI sensor device 200, which includes a substrate 210, a multilayer interconnect (MLI) 230, and an interlayer dielectric (inter-level dielectric or ILD) 240 to isolate the MLI 230 disposed therein.

Semiconductor substrate 210 may also be considered a sensor layer. The substrate 210 includes silicon. The substrate 210 may alternatively or additionally include other elementary semiconductor material such as germanium, and/or diamond. The substrate 210 may also include a compound semiconductor material such as silicon carbide, gallium arsenic, indium arsenide, and/or indium phosphide. The substrate 210 may include an alloy semiconductor such as silicon germanium, silicon germanium carbide, gallium arsenic phosphide, and/or gallium indium phosphide. The substrate 210 may include various p-type doped regions and/or n-type doped regions. All doping may be implemented using a process such as ion implantation or diffusion in various steps and techniques. The substrate 210 may include conventional isolation features (e.g., shallow trench isolation or LOCOS features), known in the art, to separate different devices formed in the substrate 210. The substrate 210 may include other features such as an epitaxial layer, a semiconductor on insulator (SOI) structure, or combinations thereof.

The semiconductor device 200 further includes MLI 230 couplable to sensor elements which are operable to properly respond to illuminated light (imaging radiation). The MLI 230 may be formed on the semiconductor substrate 210 and disposed on the frontside surface of the substrate. The MLI 230 may include conductive materials, such as metals. In one example, metals such as aluminum, aluminum/silicon/copper alloy, titanium, titanium nitride, tungsten, polysilicon, metal silicide, or combinations thereof, may be used and are referred to as aluminum interconnects. Aluminum interconnects may be formed by a process including physical vapor deposition (or sputtering), chemical vapor deposition (CVD), or combinations thereof. Other manufacturing techniques to form the metal interconnect may include photolithography processing and etching to pattern the conductive materials for vertical (via and contact) and horizontal connects (conductive line). Still other manufacturing processes such as thermal annealing may be used to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, copper multilayer interconnect may be used and include copper, copper alloy, titanium, titanium nitride, tantalum, tantalum nitride, tungsten, polysilicon, metal silicide, or combinations thereof. The copper multilayer interconnect may be formed by a technique including CVD, sputtering, plating, or other suitable processes.

The semiconductor device 200 further includes ILD 240 to isolate the MLI 230 disposed therein. The ILD structure 240 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 240 may be formed by a technique including spin-on, CVD, sputtering, or other suitable processes. The MLI 230 and ILD 240 may be formed in an integrated process including a damascene process such as dual damascene processing or single damascene processing.

The bonding process 211 may include typical bonding processes for operably coupling the carrier wafer 202 to device 200, and in particular to MLI 230 and ILD 240.

Figure 2B:
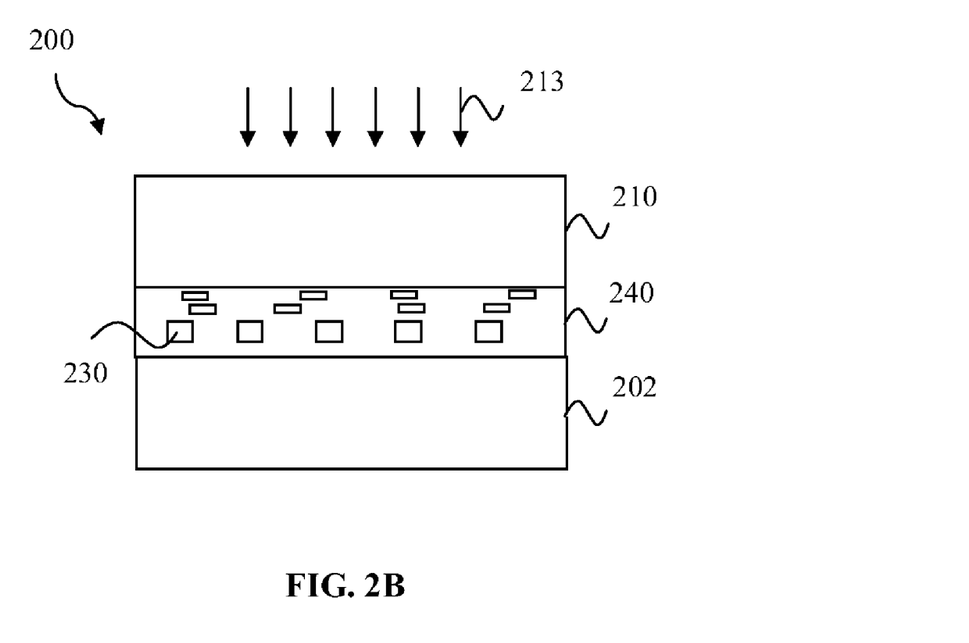
Figure 3A:
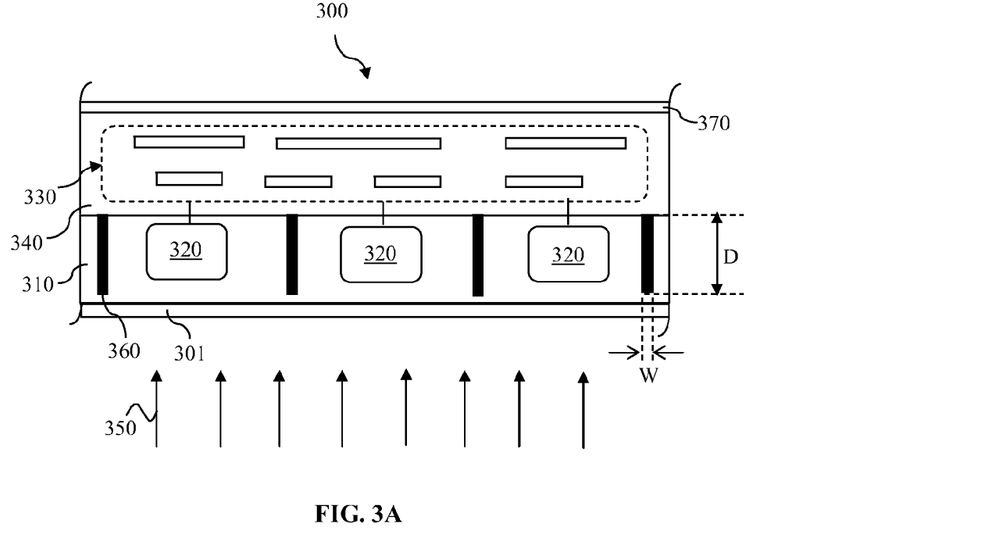
FIGS. 3A-3B illustrate a sectional view and a top view, respectively, of one embodiment of a semiconductor device having a plurality of backside illuminated sensors and a compressively-stressed dielectric layer constructed according to aspects of the present disclosure.
Figure 3B:
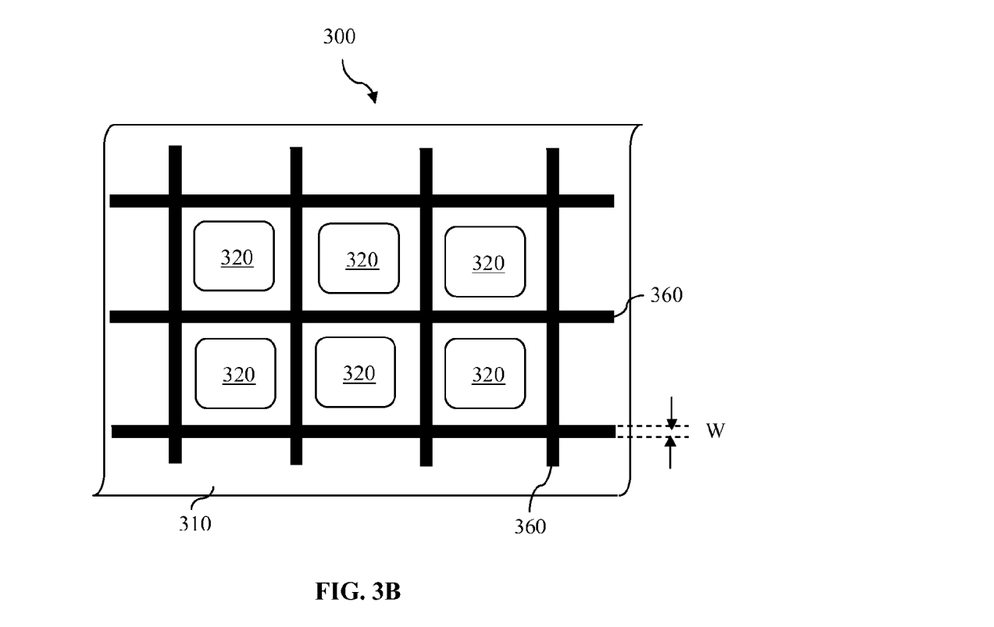

Referring now to FIG. 2B, device 200 undergoes an etch or thin down process 213 to thin the substrate 210 such that light directed through the back surface thereof may effectively reach sensor elements 220 formed within the substrate.

Figure 2C:
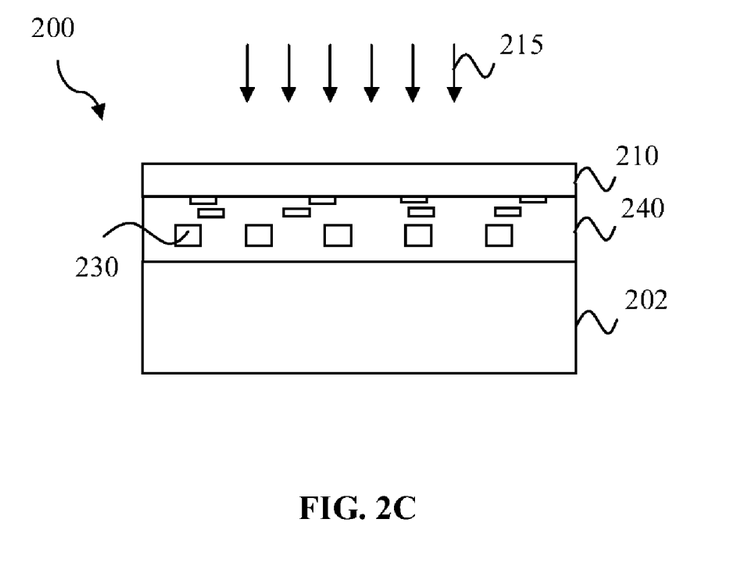

Referring now to FIG. 2C, sensor elements are formed within substrate 210 by a dopant implantation and anneal process 215. In one example, the dopant may include boron and/or other ions, and the anneal may be accomplished by using a laser. The sensor elements (or sensor pixels) formed within the semiconductor substrate may each include a light-sensing region (or photo-sensing region) which may be a doped region having N-type and/or P-type dopants formed in the semiconductor substrate 210 by a method such as diffusion or ion implantation. The light-sensing region may have a doping concentration ranging between about $10^{14}$ and $10^{21}$ atoms/cm$^3$ in one example. The sensor elements may include photodiodes, complimentary metal-oxide-semiconductor (CMOS) image sensors, charged coupling device (CCD) sensors, active sensor, passive sensor, and/or other sensors diffused or otherwise formed in the substrate 210. As such, the sensor elements may comprise conventional and/or future-developed image sensing devices. The sensor elements may include a plurality of pixels disposed in a sensor array or other proper configuration. The plurality of sensor pixels may be designed having various sensor types. For example, one group of sensor pixels are CMOS image sensors and another group of sensor pixels are passive sensors. Moreover, the sensor elements may include color image sensors and/or monochromatic image sensors. In one aspect of the present disclosure, the sensor elements may be disposed over the frontside surface and extend into the semiconductor substrate 210. In another embodiment, the sensor elements may be disposed above the frontside surface.

Figure 2D:
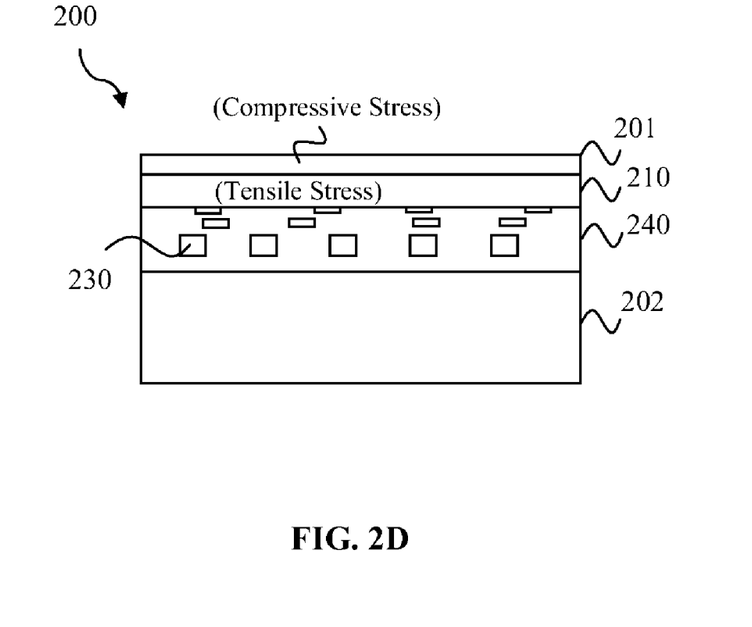

Referring now to FIG. 2D, a dielectric layer 201 is formed on the backside surface of the substrate 210, wherein the dielectric layer 201 has a compressive stress to induce a tensile stress in the substrate 210. In one embodiment, as the dielectric layer is formed under a load, compressive stress of the dielectric layer acts towards the center of the dielectric material and leads to compression of the dielectric layer. When the compressively-stressed dielectric layer 201 is formed on the substrate 210, a tensile stress leading to expansion is induced in the substrate 210. In other words, high compressive stress close to the substrate can induce tensile stress in the substrate material, increasing the band gap of the substrate material, such as silicon, and leading to reduced leakage current or dark current. For example, compressive stress greater than about 1 Pa may act on a silicon substrate to induce the silicon substrate to react and form a tensile stress silicon structure, wherein the tensile stress silicon structure can increase the energy band gap and result in lower dark current. Advantageously, tensile stress in the substrate 210 can reduce the stress impact on the substrate from subsequent processing, such as the stress impact from color filter processing and/or chip packaging.

In one embodiment, the dielectric layer 201 may have compressive stress greater than about 1 Pa, 10 MPa, or 10 GPa. In another embodiment, dielectric layer 201 may induce tensile stress in the substrate 210 greater than about 1 Pa, 10 MPa, or 10 GPa. In yet another embodiment, the dielectric layer 201 has a compressive stress between about 1 MPa and about 1 GPa, and/or dielectric layer 201 may induce a tensile stress in the substrate 210 between about 1 MPa and about 1 GPa.

In one embodiment, the compressively-stressed dielectric layer 201 is deposited directly on substrate 210 by plasma enhanced chemical vapor deposition (PECVD) with source power between about 500 watts and about 1000 watts, pressure between about 1 ton and about 5 ton, and temperature greater than about 400 degrees Celsius. Dielectric layer 201 may also be deposited by other methods and techniques, such as chemical vapor deposition (CVD) and atomic layer deposition (ALD). In one example, the dielectric layer 201 is comprised of SiN, SiON, SiC, $Ta_2O_5$, $Al_2O_3$, $HfO_2$, $ZrO_2$, $TiO_2$, or alloys thereof. In yet another example, the dielectric layer 201 is deposited to a thickness between about 200 angstroms and about 2,000 angstroms. Dielectric layer 201 may not be formed directly on substrate 210 in other embodiments, but is disposed as close as possible to the substrate so its compressive stress characteristic may maximally influence the substrate.

Advantageously, dielectric layer 201 may also be formed to function as a backside passivation layer for mechanical support and/or protection against moisture, as an etch stop layer for subsequent processing, and/or as an antireflective coating (ARC) to maximize quantum efficiency. In one example, dielectric layer 201 is formed to have a refractive index greater than about 1.9 and an extinction coefficient of about 0.

Figure 2E:
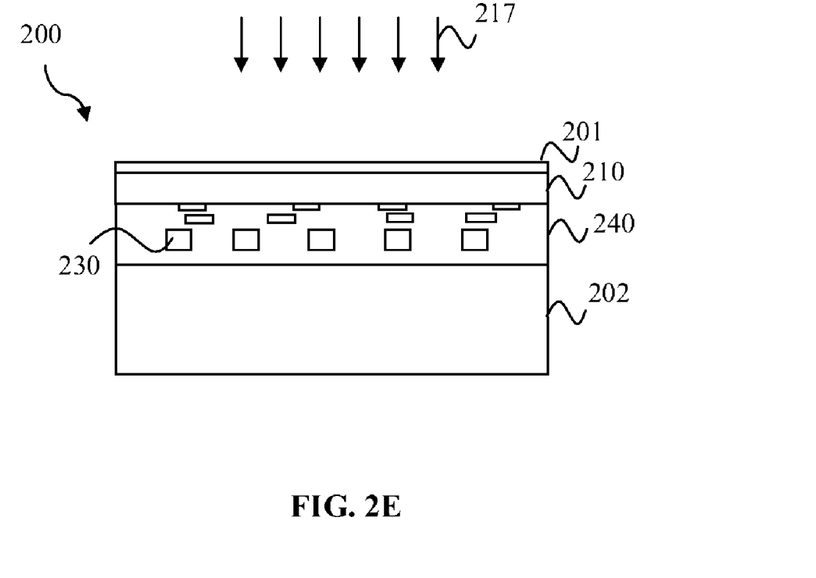

Referring now to FIG. 2E, the dielectric layer 201 may be further processed by a patterned etch process 217. Process 217 may include conventional photolithographic and etch techniques known in the art, such as the use of patterned photoresist and a dry etch.

Figure 2F:
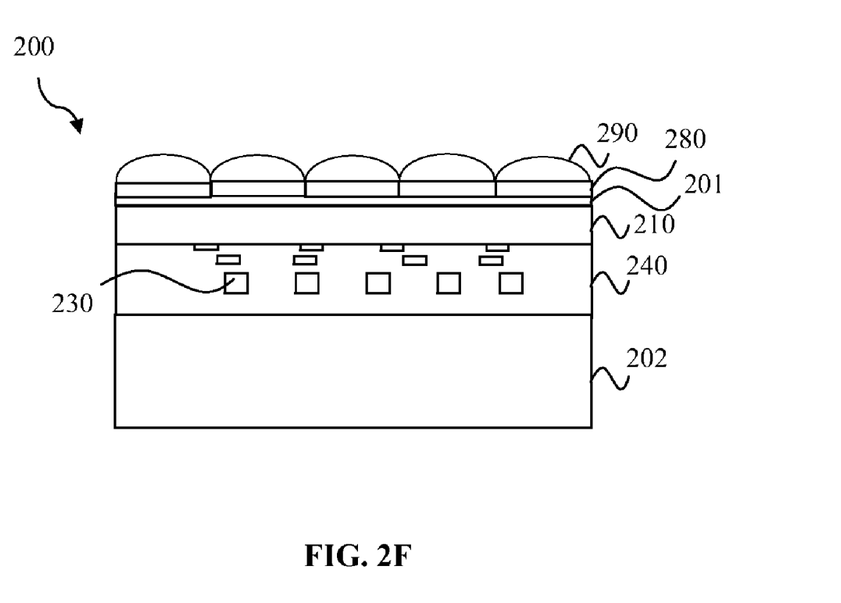

Finally, in FIG. 2F, lenses 280 and color filters 290 may be formed on etched dielectric layer 201 for color imaging applications. The micro-lens 280 is interposed between the sensor elements and the back surface of the semiconductor substrate 210, or between the color filters and the back surface, such that the backside-illuminated light can be focused on the light-sensing regions.

In the disclosed structure and the method to make the same, the illuminated light during applications may not be limited to a visual light beam, but can be extended to other optical light such as infrared (IR) and ultraviolet (UV), and other proper radiation beams.

It is understood that additional processes may be performed to complete the fabrication of the semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). A plurality of integrated circuit devices may also be formed on the frontside surface of substrate 210. For the sake of simplicity, these additional processes are not described herein.

Referring now to FIG. 3A, a sectional view of one embodiment of a semiconductor device 300 having a plurality of backside illuminated (or back-illuminated) sensors, sensor isolation features, and a compressively-stressed dielectric layer is illustrated according to aspects of the present disclosure. FIG. 3B illustrates a top view of one embodiment of the semiconductor device 300. Some features in FIG. 3A are not illustrated in FIG. 3B for simplicity and clarification. The semiconductor device 300 will now be described with reference to FIGS. 3A and 3B. Similar elements as those described above with respect to FIGS. 1 and 2A-2F are similarly numbered and may not be fully described although fully applicable in this embodiment.

The semiconductor device 300 includes a semiconductor substrate 310, which may also be considered a sensor layer. The substrate 310 includes silicon. The substrate 310 may alternatively or additionally include other elementary semiconductor material such as germanium, and/or diamond. The substrate 310 may also include a compound semiconductor material such as silicon carbide, gallium arsenic, indium arsenide, and/or indium phosphide. The substrate 310 may include an alloy semiconductor such as silicon germanium, silicon germanium carbide, gallium arsenic phosphide, and/or gallium indium phosphide. The substrate 310 may include various p-type doped regions and/or n-type doped regions. All doping may be implemented using a process such as ion implantation or diffusion in various steps and techniques. The substrate 310 may include conventional isolation features, known in the art, to separate different devices formed in the substrate 310. The substrate 310 may include other features such as an epitaxial layer, a semiconductor on insulator (SOI) structure, or combinations thereof.

The semiconductor device 300 includes sensor elements 320 (or sensor pixels) formed within the semiconductor substrate 310. In one embodiment, the sensor elements 320 may each include a light-sensing region (or photo-sensing region) which may be a doped region having N-type and/or P-type dopants formed in the semiconductor substrate 310 by a method such as diffusion or ion implantation. The light-sensing region may have a doping concentration ranging between about $10^{14}$ and $10^{21}$ atoms/cm$^3$ in one example. The sensor elements 320 may include photodiodes, complimentary metal-oxide-semiconductor (CMOS) image sensors, charged coupling device (CCD) sensors, active sensor, passive sensor, and/or other sensors diffused or otherwise formed in the substrate 310. As such, the sensor elements 320 may comprise conventional and/or future-developed image sensing devices. The sensor elements 320 may include a plurality of pixels disposed in a sensor array or other proper configuration. The plurality of sensor pixels may be designed having various sensor types. For example, one group of sensor pixels are CMOS image sensors and another group of sensor pixels are passive sensors. Moreover, the sensor elements 320 may include color image sensors and/or monochromatic image sensors. In one example, the semiconductor device 300 is designed to receive light (or radiation) 350 directed towards the back surface of the semiconductor substrate 310 during applications, eliminating obstruction of the optical paths by other objects such as gate features and metal lines, and maximizing the exposure of the light-sensing region to the illuminated light. The substrate 310 may be thinned such that the light directed through the back surface thereof may effectively reach the sensor elements 320.

The semiconductor device 300 further includes a multi-layer interconnect (MLI) 330 coupled to the sensor elements 320, such that the sensor elements 320 are operable to properly respond to illuminated light (imaging radiation). The semiconductor device 300 further includes an interlayer dielectric (inter-level dielectric or ILD) 340 to isolate the MLI 330 disposed therein. Such structures are similar to the structures described above with respect to FIGS. 2A-2F and are not described further to avoid repetition but are fully applicable in this embodiment.

The semiconductor device 300 further includes sensor isolation features 360 formed in the substrate 310 and configured to lower or substantially eliminate optical and/or electronic crosstalk between sensor elements by isolating light (radiation, or signal) targeted for each sensor element and minimizing the light spreading into other sensor elements. Thus, optical and/or electronic crosstalk among various sensor pixels in which an electric signal may be transformed from an imaging radiation signal is reduced or substantially eliminated, and the quantum efficiency (QE) factor for the device is improved.

The sensor isolation feature 360 may be disposed vertically between the ILD 340 and the backside surface of the substrate 310 (FIG. 3A). The sensor isolation feature 360 may also be disposed horizontally between two adjacent sensor elements 320 in a top view toward the backside of the substrate (FIG. 3B). In one embodiment, as illustrated in FIG. 3B, the sensor isolation feature 360 is configured as multiple squares each including one sensor element 320. The sensor isolation feature 360 may be thin and deep in dimensions such as to occupy less area of the substrate 310 and provide efficient isolation functions. As illustrated in FIGS. 3A and 3B, the sensor isolation feature 360 may be disposed between two neighboring sensor elements and have a width ranging between about 0.1 micron and about 0.5 micron in one example. The sensor isolation feature 360 may be vertically extended substantially between the backside surface and the ILD 340. In one embodiment, the sensor isolation feature 360 may run substantially along 100% of the thickness of the semiconductor substrate 310. In other embodiments, the sensor isolation feature 360 may be vertically extended along less than 100% of the thickness of the semiconductor substrate 310. In one example, the semiconductor substrate 310 may have a thickness ranging between about 1.0 micron and about 5.0 micron for illumination and imaging efficiency, and the sensor isolation feature 360 may also have a thickness ranging between about 1.0 micron and about 5.0 micron but is not limited to such a range. The sensor isolation feature 360 may further include a plurality of portions, connected or not connected, disposed in a configuration to substantially eliminate crosstalk between two adjacent sensor elements. For example, the sensor isolation feature 360 may be designed to include a fence structure having a plurality of posts interposed between neighboring sensor elements and disposed around each sensor element.

The semiconductor device 300 may further include a passivation layer 370 disposed over the MLI 330 and ILD 340.

The device 300 further includes a dielectric layer 301 as described above and is formed on substrate 310. The dielectric layer 301 has a compressive stress to induce a tensile stress in the substrate 310 and includes the features and advantages described above and may be formed as described above. Dielectric layer 301 may further function as a passivation layer, an etch stop layer, and/or an antireflective coating (ARC) layer attached to the backside surface of the semiconductor substrate 310 to provide mechanical support and protection thereof (e.g., from moisture) and to optically allow the backside-illuminated light to pass therethrough for high quantum efficiency.

The device 300 may also include color filters interposed between the sensor elements 320 and the back surface of the semiconductor substrate 310 for color imaging applications. The device 300 may include a plurality of micro-lens interposed between the sensor elements 320 and the back surface of the semiconductor substrate 310, or between the color filters and the back surface if the color filters are implemented, such that the backside-illuminated light can be focused on the light-sensing regions. The sensor isolation feature 360 may be formed by various processes compatible and integral to conventional processing technologies.

In the disclosed structure and the method to make the same, the illuminated light during applications may not be limited to a visual light beam, but can be extended to other optical light such as infrared (IR) and ultraviolet (UV), and other proper radiation beams. Accordingly, the sensor isolation feature 360 may be properly chosen and designed to effectively reflect and/or absorb the corresponding radiation beam.

It is understood that additional processes may be performed to complete the fabrication of the semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The present disclosure provides for many different embodiments. One of the broader forms of the present disclosure involves a method of fabricating a semiconductor device. The method includes providing a substrate having a frontside surface and a backside surface, and forming a plurality of sensor elements in the substrate, each of the plurality of sensor elements configured to receive light directed towards the backside surface. The method further includes forming a dielectric layer on the backside surface of the substrate, wherein the dielectric layer has a compressive stress to induce a tensile stress in the substrate.

Another of the broader forms of the present disclosure involves a backside illuminated semiconductor device. The semiconductor device includes a substrate having a frontside surface and a backside surface, and a plurality of sensor elements in the substrate, each of the plurality of sensor elements configured to receive light directed towards the backside surface. The device further includes a dielectric layer disposed on the backside surface of the substrate, wherein the dielectric layer has a compressive stress greater than about 1 Pa for inducing a tensile stress in the substrate.

Advantageously, the present disclosure provides for an improved and controllable process sequence to achieve robust BSI sensor devices with reduced leakage current or dark current.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A backside illuminated semiconductor device, comprising:
    a substrate having a frontside surface and a backside surface;
    a plurality of sensor elements in the substrate, each of the plurality of sensor elements configured to receive light directed towards the backside surface; and
    a dielectric layer disposed on the backside surface of the substrate, wherein the dielectric layer has a compressive stress greater than about 1 Pa.

2. The device of claim 1, wherein the dielectric layer has a compressive stress between about 1 MPa and about 1 GPa.

3. The device of claim 1, wherein the dielectric layer is comprised of SiN, SiON, SiC, Ta2O5, Al2O3, HfO2, ZrO2, TiO2, or alloys thereof.

4. The device of claim 1, wherein the dielectric layer has a thickness between about 200 angstroms and about 2,000 angstroms.

5. The device of claim 1, wherein the dielectric layer has a refractive index greater than about 1.9 and an extinction coefficient of about 0.

6. The device of claim 1, wherein each of the sensor elements is a photodetector selected from the group consisting of a complementary metal-oxide-semiconductor (CMOS) image sensor, a charge-coupled device sensor, an active pixel sensor, a passive pixel sensor, and combinations thereof.

7. The device of claim 1, wherein the dielectric layer is an anti-reflective coating (ARC) film.

8. The device of claim 1, wherein the dielectric layer is an etch stop layer or a passivation layer.

9. The device of claim 1, further comprising integrated circuit devices on the frontside surface of the substrate.

10. The device of claim 1, further comprising a plurality of color filters on the dielectric layer.

11. A backside illuminated semiconductor device comprising:
   a substrate;
   at least one complementary metal-oxide-semiconductor (CMOS) image sensor element in the substrate, configured to receive light directed towards a backside surface of the substrate; and
   a dielectric layer on the backside surface of the substrate and at least partially aligned with the sensor element, wherein the dielectric layer is stressed.

12. The device of claim 11, wherein the dielectric layer has a compressive stress greater than 10 GPa.

13. The device of claim 11, wherein the dielectric layer is comprised of SiN, SiON, SiC, Ta2O5, Al2O3, HfO2, ZrO2, TiO2, or alloys thereof.

14. The device of claim 11, wherein the dielectric layer is deposited by plasma enhanced chemical vapor deposition (PECVD).

15. The device of claim 11, wherein the dielectric layer is deposited by chemical vapor deposition (CVD).

16. The device of claim 11, wherein the dielectric layer has a thickness between about 200 angstroms and about 2,000 angstroms.

17. The device of claim 11, wherein the dielectric layer has a refractive index greater than about 1.9 and an extinction coefficient of about 0.

18. The device of claim 11, further comprising a color filter on the dielectric layer.

19. The device of claim 11, wherein the substrate includes ions implanted through a backside of the substrate.

* * * * *